(12) United States Patent
Kawanami

(10) Patent No.: US 8,749,758 B2
(45) Date of Patent: Jun. 10, 2014

(54) EXPOSURE APPARATUS AND METHOD OF MANUFACTURING DEVICE

(75) Inventor: Kentarou Kawanami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/410,391

(22) Filed: Mar. 2, 2012

(65) Prior Publication Data

US 2012/0224163 A1 Sep. 6, 2012

(30) Foreign Application Priority Data

Mar. 3, 2011 (JP) ................................. 2011-046971

(51) Int. Cl.
*G03B 27/68* (2006.01)
*G03B 27/54* (2006.01)
*G03F 7/20* (2006.01)

(52) U.S. Cl.
CPC ............... *G03F 7/70358* (2013.01); *G03F 7/706* (2013.01)
USPC .............................................. 355/52; 355/53

(58) Field of Classification Search
CPC .. G03F 7/70358; G03F 7/706; G03F 7/70258
USPC ........................... 355/52, 53, 55, 67; 250/548; 356/399–401
See application file for complete search history.

(56) References Cited

U.S. PATENT DOCUMENTS 5,841,520 A * 11/1998 Taniguchi ........................ 355/53
6,396,569 B2 * 5/2002 Zheng et al. .................... 355/77
6,437,858 B1 * 8/2002 Kouno et al. ................. 356/124
7,123,347 B2 * 10/2006 Suzuki ............................ 355/67
2010/0177290 A1 * 7/2010 Toyama et al. ................. 355/55

FOREIGN PATENT DOCUMENTS

| JP | 1-228130 A | 9/1989 |
|---|---|---|
| JP | 2006-332168 A | 12/2006 |
| TW | 200907598 A | 2/2009 |

OTHER PUBLICATIONS

Taiwanese Office Action cited in Taiwanese counterpart application No. TW101106971 dated Mar. 12, 2014. English translation provided.

* cited by examiner

*Primary Examiner* — Hung Henry Nguyen
(74) *Attorney, Agent, or Firm* — Rossi, Kimms & McDowell LLP

(57) ABSTRACT

An apparatus includes original positioning mechanism which positions original stage, substrate positioning mechanism which positions substrate stage, measurement device mounted on the substrate stage, and controller. One of original and the original stage is provided with first measurement pattern including patterns, at least one of pitches and widths thereof being different from each other. The measurement device includes second measurement pattern, and sensor configured to detect light passed through the first and second measurement patterns, and a projection optical system. The controller determines illuminated region, within which the first measurement pattern is to be illuminated, using information related to the original, and obtains information related to an image of the first measurement pattern within the illuminated region based on an output from the sensor.

11 Claims, 6 Drawing Sheets

FIG. 4

| | PATTERN A | PATTERN B | ACTUAL PATTERN |
|---|---|---|---|
| WAVELENGTH FOR EXPOSURE [μm] | 0.4 | | |
| NA | 0.083 | | |
| σ | 0.9 | | |
| LINE WIDTH [μm] | 5 | 3 | 5 |
| PITCH [μm] | 20 | 6 | 10 |
| Z4 | 225.8 | 225.8 | 225.8 |
| Z5 | 0.0 | 0.0 | 0.0 |
| Z6 | 0.0 | 0.0 | 0.0 |
| Z7 | 0.0 | 0.0 | 0.0 |
| Z8 | 0.0 | 0.0 | 0.0 |
| Z9 | −58.4 | −139.1 | −113.4 |
| Z10 | 0.0 | 0.0 | 0.0 |
| Z11 | 0.0 | 0.0 | 0.0 |
| Z12 | 0.0 | 0.0 | 0.0 |
| Z13 | 0.0 | 0.0 | 0.0 |
| Z14 | 0.0 | 0.0 | 0.0 |
| Z15 | 0.0 | 0.0 | 0.0 |
| Z16 | −21.1 | 46.5 | 5.0 |
| Z17 | 18.0 | 13.9 | 3.4 |
| Z18 | 0.0 | 0.0 | 0.0 |
| Z19 | 0.0 | 0.0 | 0.0 |
| Z20 | 0.0 | 0.0 | 0.0 |
| Z21 | 0.0 | 0.0 | 0.0 |
| Z22 | 0.0 | 0.0 | 0.0 |
| Z23 | 0.0 | 0.0 | 0.0 |
| Z24 | 0.0 | 0.0 | 0.0 |
| Z25 | 13.8 | −17.4 | 16.1 |
| Z26 | 0.0 | 0.0 | 0.0 |
| Z27 | 0.0 | 0.0 | 0.0 |
| Z28 | −16.4 | −8.3 | 6.2 |
| Z29 | 0.0 | 0.0 | 0.0 |
| Z30 | 0.0 | 0.0 | 0.0 |
| Z31 | 0.0 | 0.0 | 0.0 |
| Z32 | 0.0 | 0.0 | 0.0 |
| Z33 | 0.0 | 0.0 | 0.0 |
| Z34 | 0.0 | 0.0 | 0.0 |
| Z35 | 0.0 | 0.0 | 0.0 |
| Z36 | −0.5 | 11.7 | −4.6 |

|  | PATTERN A | PATTERN B | PATTERN C | ACTUAL PATTERN |
|---|---|---|---|---|
| Z9 | 50 | 100 | 150 | 80 |
| Z16 | 10 | 30 | 20 | 16 |

EXPOSURE APPARATUS AND METHOD OF MANUFACTURING DEVICE

BACKGROUND OF THE INVENTION

1. Field of the Invention

The present invention relates to an exposure apparatus and a method of manufacturing a device using the same.

2. Description of the Related Art

To align an original and a substrate in an exposure apparatus, a method there has been proposed of arranging a measurement pattern on the object plane of a projection optical system of the exposure apparatus, and measuring the position of an image of the measurement pattern, which is formed by the projection optical system. In a method disclosed in Japanese Patent Laid-Open No. 1-228130, a sample mask having a light transmissive pattern formed on it is arranged at the position where an original is arranged, and an exposure sample plate having a reduced light transmissive pattern formed on it is arranged at the position where an object to be exposed is arranged. The amount of exposure light having passed through the sample mask and exposure sample plate is measured to detect the optimum position of the object to be exposed. In a method disclosed in Japanese Patent Laid-Open No. 2006-332168, an aberration measurement pattern including two or more types of marks is illuminated, images of the measurement patterns, which are formed by a projection optical system, are measured, the amount of wavefront aberration of the projection optical system is calculated using Zernike polynomials, and the optical characteristics of the projection optical system are corrected.

In the method disclosed in Japanese Patent Laid-Open No. 1-228130, if a measurement pattern (light transmissive pattern) and an actual device pattern have, for example, different line widths and line array pitches, their images are generally formed at different positions. Hence, even when the substrate is positioned based on the position of an image, which is measured using the measurement pattern, the position where the substrate is positioned is different from a position optimum for the actual device pattern, so an error may occur. This happens because the position of an image for the wavefront aberration of the projection optical system varies in each individual pattern.

In the method disclosed in Japanese Patent Laid-Open No. 2006-332168, the wavefront aberration of the projection optical system can be obtained, so the position of an image for the actual device pattern can be accurately corrected using the sensitivity of the actual device pattern. Unfortunately, the method disclosed in Japanese Patent Laid-Open No. 2006-332168 poses the following two problems. First, because the wavefront aberration of the projection optical system must be obtained up to, for example, the 36th terms of Zernike polynomials, a large number of types of measurement patterns are necessary, thus requiring an enormous amount of time to measure images of these measurement patterns. Second, because a large number of measurement patterns are used, the wavefront aberration of the projection optical system changes in the period from when an image of one measurement pattern is measured until an image of another measurement pattern is measured, leading to a measurement error of the wavefront aberration.

SUMMARY OF THE INVENTION

The present invention provides a technique advantageous in estimating or determining the position of an image of an actual device pattern at high speed and high accuracy.

The first aspect of the present invention provides an exposure apparatus which projects an image of a pattern of an original onto a substrate by a projection optical system to expose the substrate to light, the apparatus comprising: an original positioning mechanism configured to position an original stage which holds the original; a substrate positioning mechanism configured to position a substrate stage which holds the substrate; a measurement device mounted on the substrate stage; and a controller, wherein one of the original and the original stage is provided with a first measurement pattern including a plurality of patterns, at least one of pitches and widths thereof being different from each other, and the measurement device including a second measurement pattern obtained by reducing the first measurement pattern in accordance with a projection magnification of the projection optical system, and a sensor configured to detect light passed through the first measurement pattern, the projection optical system, and the second measurement pattern, and wherein the controller is configured to determine an illuminated region, within which the first measurement pattern is to be illuminated, using information related to the original, and to obtain information related to an image of the first measurement pattern within the illuminated region, based on an output from the sensor obtained while illuminating the first measurement pattern within the determined illuminated region and moving the substrate stage.

The second aspect of the present invention provides a method of manufacturing a device, the method comprising the steps of: exposing a substrate to light using an exposure apparatus defined as the first aspect; and developing the exposed substrate.

Further features of the present invention will become apparent from the following description of exemplary embodiments with reference to the attached drawings.

BRIEF DESCRIPTION OF THE DRAWINGS

FIG. 4 is a table illustrating the sensitivities of the focus positions to the coefficients (Zernike coefficients) of the respective terms of Zernike polynomials;

DESCRIPTION OF THE EMBODIMENTS

Figure 1:
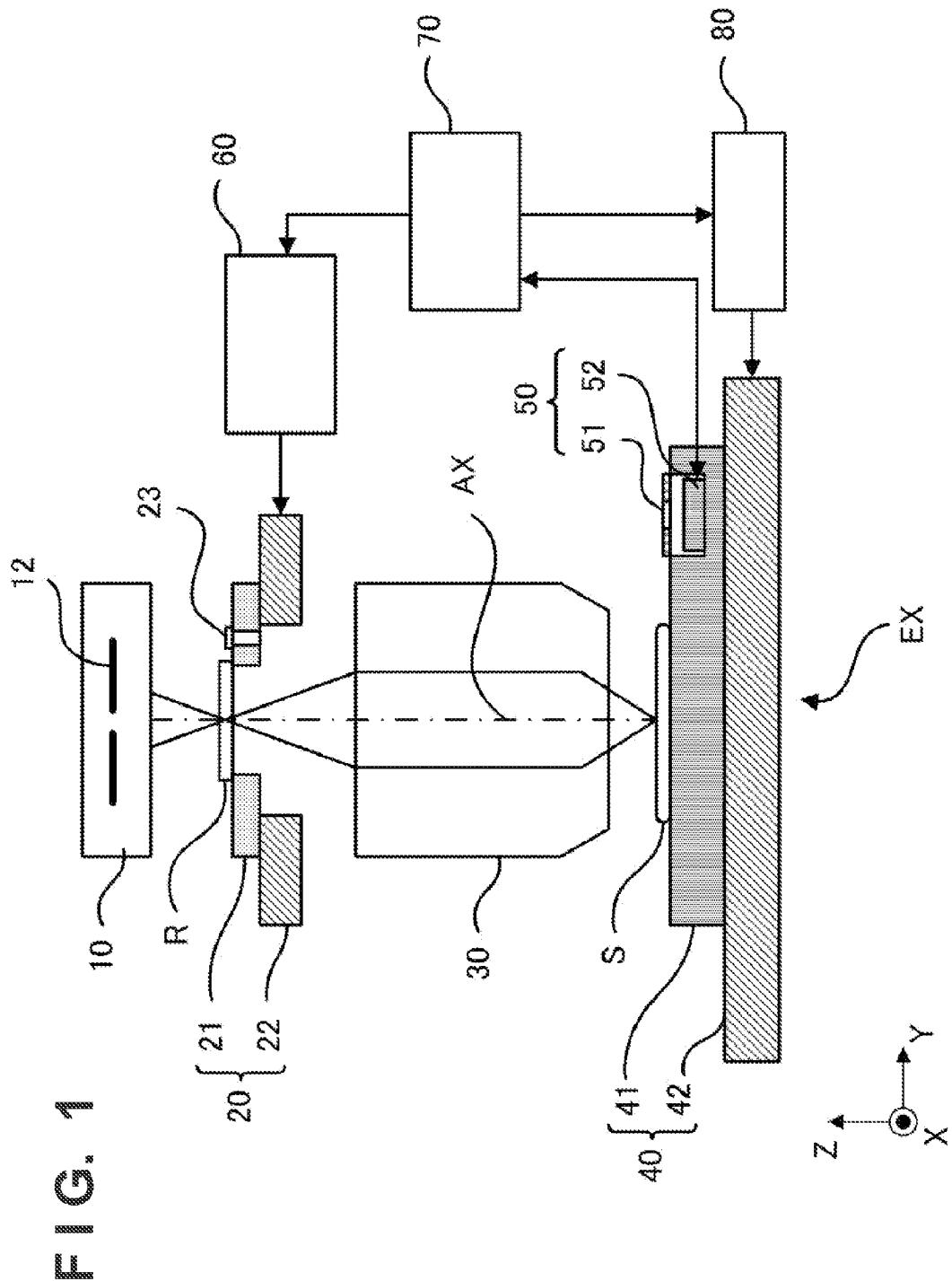
FIG. 1 is a view showing the schematic configuration of an exposure apparatus according to an embodiment of the present invention.

FIG. 1 is a view showing the schematic configuration of an exposure apparatus EX according to an embodiment of the present invention. The exposure apparatus is configured to project the pattern (actual device pattern) of an original R illuminated by an illumination optical system 10 onto a substrate S by a projection optical system 30 to expose the substrate S. The original R is arranged on the object plane of the projection optical system 30, and the substrate S is arranged on the image plane of the projection optical system 30. The exposure apparatus may be configured as an apparatus (stepper) which exposes the substrate S while the original R and substrate S stand still relative to each other, or an apparatus (scanner) which exposes the substrate S while scanning them. The illumination optical system 10 can include a masking blade 12 which defines the region within which the original R is to be illuminated.

The original R is positioned by an original positioning mechanism 20. The original positioning mechanism 20 positions an original stage 21 which holds the original R, thereby positioning the original R. The original positioning mechanism 20 includes, for example, the original stage 21 including an original chuck which holds the original R, and an original stage driving mechanism 22 which drives the original stage 21. A first measurement pattern 23 is provided on the original stage 21 or original R, and positioned by the original positioning mechanism 20. The substrate S is positioned by a substrate positioning mechanism 40. The substrate positioning mechanism 40 positions a substrate stage 41 which holds the substrate S, thereby positioning the substrate S. The substrate positioning mechanism 40 includes, for example, the substrate stage 41 including a substrate chuck which holds the substrate S, and a substrate stage driving mechanism 42 which drives the substrate stage 41.

Driving of the original stage 21 by the original stage driving mechanism 22 is controlled by an original stage controller 60 based on the measurement result obtained by a measurement unit (for example, a laser interferometer) (not shown) which measures the position of the original stage 21. The original stage controller 60 controls the original stage driving mechanism 22 in accordance with a command from a controller 70. Driving of the substrate stage 41 by the substrate stage driving mechanism 42 is controlled by a substrate stage controller 80 based on the measurement result obtained by another measurement unit (for example, a laser interferometer) (not shown) which measures the position of the substrate stage 41. The substrate stage controller 80 controls the substrate stage driving mechanism 42 in accordance with a command from the controller 70.

An image of the first measurement pattern 23 illuminated by the illumination optical system 10 is formed on the image plane of the projection optical system 30 by the projection optical system 30. A measurement device 50 for detecting the position of an image of the first measurement pattern 23, which is formed by the projection optical system 30, is mounted on the substrate stage 41. The measurement device 50 can be configured to detect the position in the X, Y, and Z directions as the position of an image of the first measurement pattern 23. Note that an axis parallel to an optical axis AX of the projection optical system 30 is defined as the Z axis, and a plane perpendicular to the optical axis AX is defined as the X-Y plane. The measurement device 50 can include a second measurement pattern 51 obtained by reducing the first measurement pattern 23 in accordance with the projection magnification of the projection optical system 30, and a sensor 52 which detects light that is transmitted through the first measurement pattern 23 and projection optical system 30 and further transmitted through the second measurement pattern 51.

The light detected by the sensor 52 has a maximum intensity when the position of an image of the first measurement pattern 23, which is formed by the projection optical system 30, and the position of the second measurement pattern 51 coincide with each other, that is, when the first measurement pattern 23 and second measurement pattern 51 are arranged at conjugate positions. Therefore, the position of an image of the first measurement pattern 23, which is formed by the projection optical system 30, can be measured based on the output from the sensor 52 when the substrate stage 41 is moved. A process of measuring the position of an image of the first measurement pattern 23 is controlled by the controller 70. The positional relationship between the first measurement pattern 23 and the pattern (actual device pattern) of the original R can be measured by a measurement system (not shown). Also, in an image position measurement process in which the position of an image of the first measurement pattern 23 is measured, and an exposure process in which the pattern of the original R is transferred onto the substrate S (both will be described later), the first measurement pattern 23 and original R are positioned on the object plane of the projection optical system 30. Therefore, the controller 70 can estimate or determine the position of an image of the pattern (actual device pattern) of the original R in exposure, based on the position of an image of the first measurement pattern 23. Note that in an image position measurement process and exposure process, when the first measurement pattern 23 and original R are positioned on the object plane of the projection optical system 30, the focus position in the image position measurement process and that in the exposure process coincide with each other.

Figure 2:
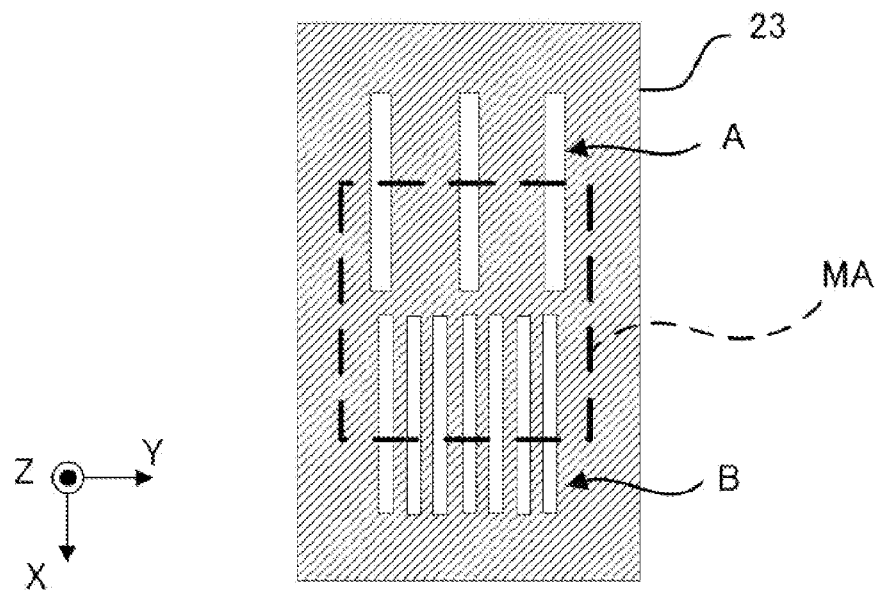
FIG. 2 is a view illustrating an example of the configuration of a first measurement pattern.

The first measurement pattern 23 is formed by arranging a plurality of different patterns A and B in different regions, as illustrated in FIG. 2. Referring to FIG. 2, white portions indicate light transmissive portions, and a hatched portion indicates a light shielding portion. The plurality of patterns A and B can be, for example, line-and-space patterns. The plurality of different patterns can be, for example, patterns having different line widths and/or line array pitches.

Figure 3:
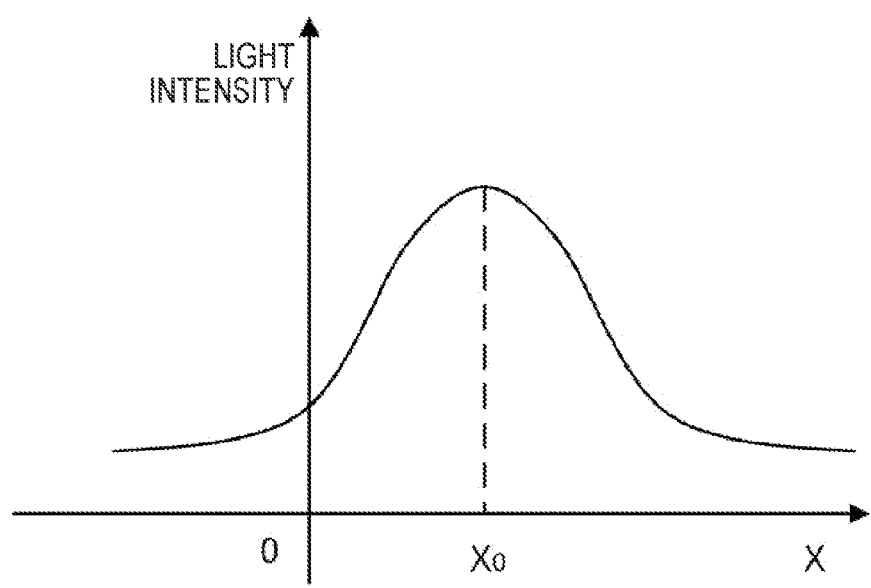
FIG. 3 is a graph for explaining a process of measuring the position of an image.

A process (to be referred to as an image position measurement process hereinafter) of using the measurement device 50 to measure the position of an image of the first measurement pattern 23, which is formed by the projection optical system 30, will be described below. First, the first measurement pattern 23 on the side of the original stage 21 is arranged at the measurement position (for example, on the optical axis AX of the projection optical system 30), and the second measurement pattern 51 on the side of the substrate stage 41 is arranged at the measurement position. Next, the controller 70 causes the substrate stage driving mechanism 42 to finely drive the substrate stage 41 (second measurement pattern 51) in the X, Y, and Z directions. At this time, the controller 70 determines a coordinate position $(X_0, Y_0, Z_0)$ in the X, Y, and Z directions, at which the intensity of light which is transmitted through the second measurement pattern (light transmissive portions) 51 and detected by the sensor 52, maximizes. The coordinate position $(X_0, Y_0, Z_0)$ is the position of the substrate stage 41 when the first measurement pattern 23 and second measurement pattern 51 are arranged at conjugate positions. FIG. 3 is a graph illustrating the relationship between the intensity of light detected by the sensor 52, and the position of the substrate stage 41 in the X direction. The same result can be obtained when the substrate stage 41 is driven in the Y direction and it is driven in the Z directions as well.

In this embodiment, the controller 70 determines a measurement region (illuminated region) MA, to be illuminated in an image position measurement process, of the entire region of the first measurement pattern 23 in accordance with the original R used in exposure. The controller 70 then measures the position of an image of the first measurement pattern 23, which is formed by the projection optical system 30, based on the output from the sensor 52 in an image position measurement process performed using the measurement region MA. Note that the controller 70 can determine the measurement region MA in accordance with an instruction in, for example, a recipe file containing information that serves to control exposure (for example, containing pieces of information such as the ID of the original R, the illumination conditions, and the shot layout). Alternatively, the controller 70 can determine the measurement region MA in accordance with the features of the actual device pattern of the original R, such as its line width and/or line array pitch. Determination of the measurement region MA corresponding to the features of the actual device pattern can be done by, for example, looking up a table including a combination of the features of the actual device pattern of the original R and the measurement region MA suitable for these features. The actual device pattern means herein a pattern to be transferred onto the substrate S to form a device. Determination of the measurement region MA corresponding to the features of the actual device pattern can also be done by performing calculation in accordance with the features of the actual device pattern by the controller 70. Alternatively, as a simpler method, determination of the measurement region MA corresponding to the features of the actual device pattern can be done by looking up a table including a combination of the original R and the measurement region suitable for it.

An exemplary method of determining the measurement region MA suitable for the actual device pattern (its features) of the original R will be described below. FIG. 4 illustrates the sensitivities of the focus positions to the respective terms (Z4 to Z36) of Zernike polynomials describing the wavefront aberration of the projection optical system 30 for the patterns A and B of the first measurement pattern 23 and the actual device pattern of the original R, their illumination conditions (wavelengths for exposure, NA, and σ), and the pattern conditions (line widths and pitches). Note that the actual device pattern is described as an "Actual Pattern" in FIG. 4.

As is obvious from FIG. 4, the patterns A and B and the actual device pattern have different sensitivities to the wavefront aberration. When, for example, the coefficient of the ninth term of the Zernike polynomial describing the wavefront aberration of the projection optical system 30 is 10 mλ, these patterns have the following focus positions:

Focus Position of Pattern A (FA)=−0.584 μm
Focus Position of Pattern B (FB)=−1.391 μm
Focus Position of Actual Device Pattern (FP)=−1.134 μm Therefore, when an image position measurement process is executed using only the pattern A or B, a corresponding error is generated in the measurement result. When images of the patterns A and B are measured at once using the single measurement device 50, a focus position ($=Z_0$) F' measured using the measurement device 50 can be expressed as:

$$F' = FA \times \alpha + FB \times (1-\alpha) \quad (1)$$

where $\alpha$ ($\leq 1$) is the ratio of the area occupied by the pattern A in the measurement region MA (to be also simply referred to as the area ratio hereinafter), and $(1-\alpha)$ is the ratio of the area occupied by the pattern A in the measurement region MA because the first measurement pattern 23 is formed by the two patterns A and B in this example.

Figure 5:
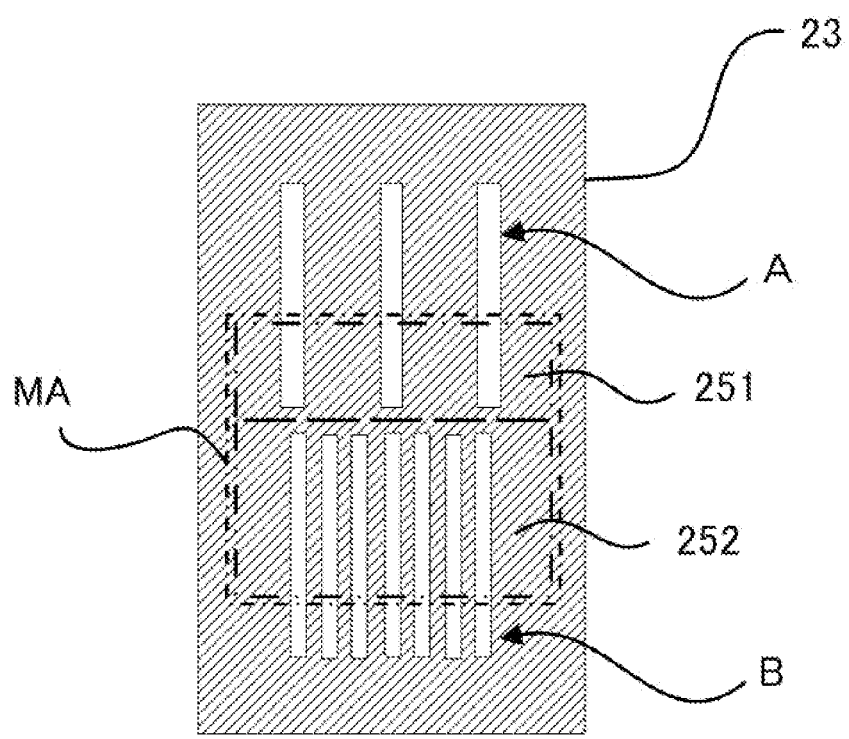
FIG. 5 is a view illustrating an example of setting of a measurement region.

It is possible to obtain an α value at which F' and FP have the same value, and determine the measurement region MA, as illustrated in FIG. 5, in accordance with the α value. In the above-mentioned example, the pattern A has an area ratio of 31.9%, and the pattern B has an area ratio of 68.1%. The measurement region MA is determined so as to satisfy the area ratios of the patterns A and B. This makes it possible to reduce a measurement error due to the differences between the features of the actual device pattern and those of the patterns A and B of the first measurement pattern 23.

The measurement region MA can be a region, illuminated by the illumination optical system 10 in an image position measurement process, of the entire region of the first measurement pattern 23. In this case, the measurement region MA can be defined by, for example, a masking blade 12 that serves to define the illuminated region. Alternatively, the measurement region MA can be a region, illuminated with light from the first measurement pattern 23 in an image position measurement process, of the entire region of the second measurement pattern 51. In this case, the measurement region MA can be defined by, for example, a light shielding member (not shown) provided on the second measurement pattern 51.

When the wavefront aberration of the projection optical system 30 is described by a plurality of terms of Zernike polynomials, it can be expressed from the Zernike orthogonality as:

$$\text{Focus Position} = \sum_{i=4}^{N} S_i \times C_i \quad (2)$$

where C is the Zernike coefficient of the wavefront aberration, S is the sensitivity illustrated in FIG. 4, i is the term of the Zernike polynomial (to be referred to as the Zernike term hereinafter), and N is the maximum Zernike term to be taken into consideration.

Hence, it is desirable to determine the area ratio of each pattern in measurement so that the focus positions F' and FP obtained based on the respective Zernike terms coincide with each other as much as possible, that is, the sensitivities of the focus positions to the respective Zernike terms coincide with each other as much as possible.

Figure 6:
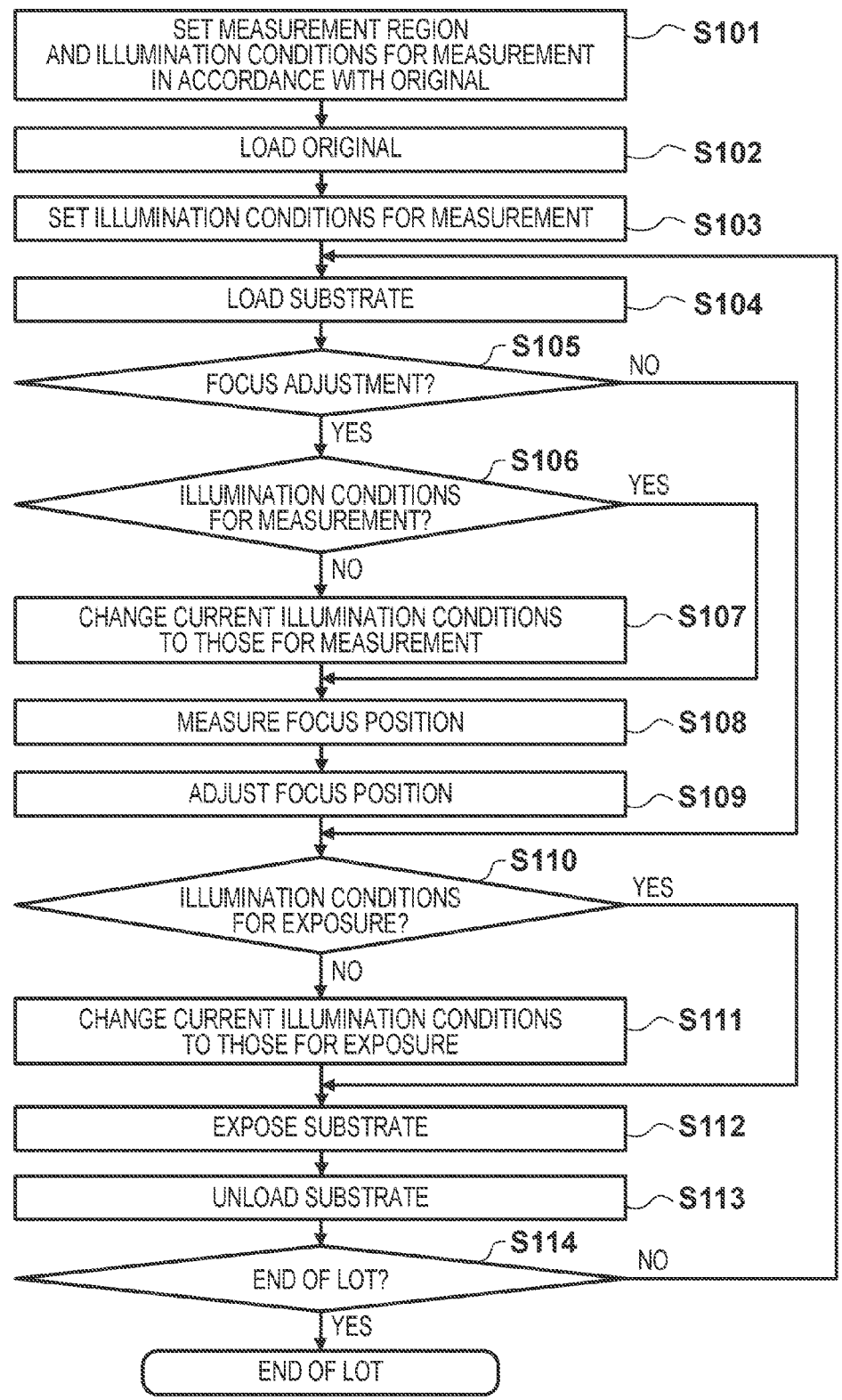
FIG. 6 is a flowchart illustrating a method of exposing a substrate.
Figures 7, 8:
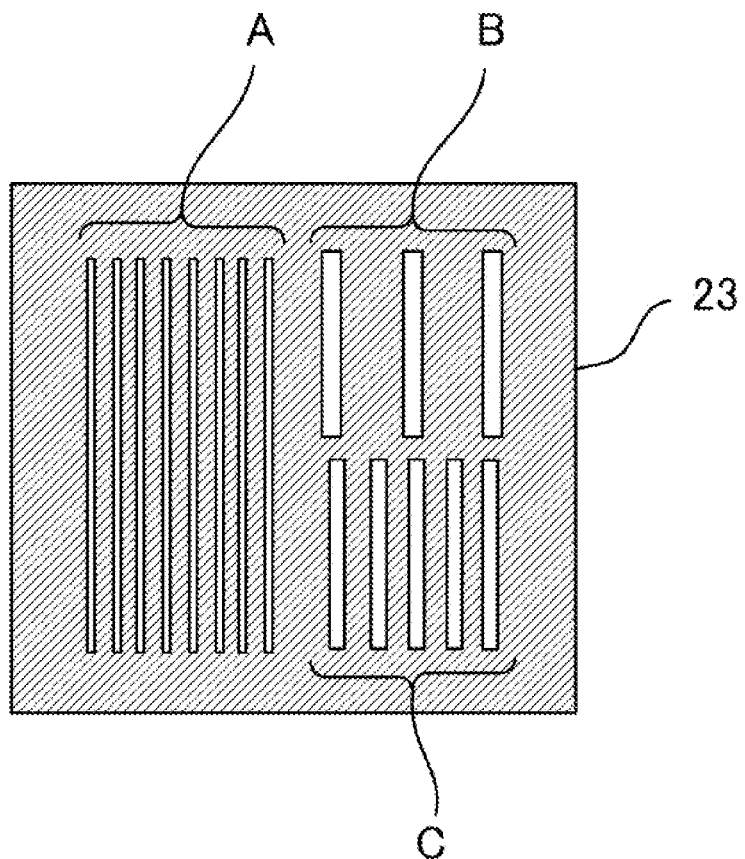
FIG. 7 is a view illustrating another example of the configuration of a first measurement pattern.
FIG. 8 is a graph illustrating the sensitivities of the focus positions to the coefficients of the ninth and 16th terms of Zernike polynomials.

A more detailed embodiment of the present invention will be described below with reference to FIGS. 6 to 8. FIG. 6 is a flowchart showing a method of exposing the substrate S by the exposure apparatus EX. A process shown in this flowchart is controlled by the controller 70. A method of matching the sensitivities of the focus position of the first measurement pattern 23 to the coefficients of the ninth and 16th terms with those of the focus position of the actual device pattern of the original R to these coefficients to correct defocus will be described below.

First, in step S101, the controller 70 determines the area ratios of a plurality of patterns A, B, and C of the first measurement pattern 23, and their illumination conditions in measurement. The illumination conditions mean herein, for example, the conditions (for example, NA and σ) in which the effective light source distribution is determined. An exemplary process of determining the area ratio by an arithmetic operation will be described below. However, the area ratio may be determined in accordance with an instruction in a recipe file, by looking up a table, or by other methods, as described earlier. In this case, the first measurement pattern 23 is formed by three types of patterns A, B, and C, as illustrated in FIG. 7. As illustrated in FIG. 7, sensitivities $S_9$ and $S_{16}$ of the focus position of the actual device pattern to the ninth and 16th terms of the Zernike polynomials can be expressed as:

$$S_9 = S_{9A} \times \alpha + S_{9B} \times \beta + S_{9C} \times (1-\alpha-\beta) \quad (3)$$

$$S_{16} = S_{16A} \times \alpha + S_{16B} \times \beta + S_{16C} \times (1-\alpha-\beta) \quad (4)$$

where $S_{9A}$, $S_{9B}$, and $S_{9C}$ are the sensitivities of the focus positions of the patterns A, B, and C, respectively, to the coefficient of the ninth term of the Zernike polynomial, $S_{16A}$, $S_{16B}$, and $S_{16C}$ are the sensitivities of the focus positions of the patterns A, B, and C, respectively, to the coefficient of the 16th term of the Zernike polynomial, a is the area ratio of the pattern A, β is the area ratio of the pattern B, and (1−α−β) is the area ratio of the pattern C. $S_{9A}$, $S_{9B}$, $S_{9C}$, $S_9$, $S_{16A}$, $S_{16B}$, $S_{16C}$, and $S_{16}$ can be obtained by simulation or actual measurement. Solving simultaneous equations of expressions (3) and (4) yields the area ratios α, β, and (1−α−β) of the patterns A, B, and C, respectively. However, α and β are area ratios, which satisfy constraints:

$$0 \leq \alpha \leq 1 \quad (5)$$

$$0 \leq \beta \leq 1 \quad (6)$$

$$\alpha + \beta \leq 1 \quad (7)$$

If constraints (5), (6), and (7) cannot be satisfied, it is necessary to change the illumination conditions in measurement to change the sensitivities $S_{9A}$, $S_{9B}$, $S_{9C}$, $S_{16A}$, $S_{16B}$, and $S_{16C}$ of the measurement patterns A, B, and C, thereby searching for illumination conditions which satisfy these constraints. The illumination conditions in measurement desirably coincide with those in exposing the substrate S in terms of the throughput. When the sensitivities of the focus positions of the measurement patterns A, B, and C and actual device pattern are as shown in FIGS. 8, α=0.6 and β=0.2. Note that the actual device pattern is described as an "Actual Pattern" in FIG. 4.

In step S102, the original R is loaded onto the original stage 21 under the control of the controller 70. In step S103, the controller 70 sets, in the illumination optical system 10, the illumination conditions determined in step S101. In step S104, the controller 70 loads the substrate S onto the substrate stage 41. In step S105, the controller 70 determines whether focus adjustment is to be executed. If it is determined in step S105 that focus adjustment is not to be executed, the process directly advances to step S110; otherwise, the process advances to step S106.

In step S106, the controller 70 determines whether the illumination conditions for measurement, which are determined in step S101, are set. If it is determined in step S106 that the illumination conditions for measurement are set, the process directly advances to step S108; otherwise, the process advances to step S107. In step S107, the controller 70 sets the illumination conditions of the illumination optical system 10 to those determined in step S101.

In step S108, the controller 70 defines the illuminated region (measurement region MA), within which the first measurement pattern 23 is to be illuminated, using the masking blade 12 so that the area ratios of the plurality of patterns which form the first measurement pattern 23 become those determined in step S101. The position of an image of the first measurement pattern 23 is measured based on the output from the sensor 52 when the first measurement pattern 23 is illuminated with the defined illuminated region. Although the position of an image to be measured is assumed herein to be the focus position (the position of an image in the optical axis direction (Z direction)), the position of the image in the X and Y directions may also be measured.

In step S109, the controller 70 adjusts the position of the substrate stage 41 in the optical axis direction (Z direction) so that the pattern of the original R is projected onto the substrate S in a best focus state, based on the focus position measured in step S108. In step S110, it is determined whether illumination conditions for exposing the substrate S are set as the current illumination conditions. If illumination conditions for exposing the substrate S are not set, the process advances to step S110. On the other hand, if illumination conditions for exposing the substrate S are set, the process advances to step S112.

In step S111, the controller 70 sets the illumination conditions for exposing the substrate S in the illumination optical system 10. In step S112, the controller 70 executes an exposure process on the substrate S. In this exposure process, the original R is illuminated by the illumination optical system 10 under the set illumination conditions so that the pattern of the original R is projected onto the substrate S by the projection optical system 30. In step S113, the exposed substrate S is unloaded from the substrate stage 41 under the control of the controller 70. In step S114, the controller 70 determines whether exposure of all substrates S which constitute a lot is complete. If a substrate S to be exposed remains, the process returns to step S104.

As described above, according to the embodiment of the present invention, a measurement pattern formed by arranging a plurality of different patterns in different regions is used to determine the measurement region, to be used in an image position measurement process, of the entire region of this measurement pattern, in accordance with the original. This makes it possible to estimate or determine the position of an image of the actual device pattern of the original at high speed and high accuracy. Note that various methods are available as a method of determining the measurement region. To determine a measurement region corresponding to the original by, for example, looking up a table including a combination of the original and the measurement region suitable for it, the controller can determine the measurement region without performing neither simulation nor an arithmetic operation and with no concern for the characteristics of the original.

A method of manufacturing a device (for example, a semiconductor device or a liquid crystal display device) according to an embodiment of the present invention will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer, coated with a photosensitive agent, using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate, coated with the photosensitive agent, using the above-mentioned exposure apparatus, and a step of developing the glass substrate. The method of manufacturing a device according to this embodiment can manufacture a device with a quality higher than those of devices manufactured by the related art techniques.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-046971, filed Mar. 3, 2011, which is hereby incorporated by reference herein in its entirety.

What is claimed is:

1. An exposure apparatus which projects an image of a pattern of an original onto a substrate by a projection optical system to expose the substrate to light, the apparatus comprising:

an original positioning mechanism configured to position an original stage which holds the original;
a substrate positioning mechanism configured to position a substrate stage which holds the substrate;
a measurement device mounted on the substrate stage; and
a controller,
wherein one of the original and the original stage is provided with a first measurement pattern including a plurality of patterns, at least one of pitches and widths thereof being different from each other, and the measurement device including a second measurement pattern, and a sensor configured to detect light passed through the first measurement pattern, the projection optical system, and the second measurement pattern,
wherein an illuminated region, within which the first measurement pattern is to be illuminated, is set so that a part of each of the plurality of patterns, which corresponds to area ratios of the plurality of patterns within the illuminated region, is illuminated, the area ratios of the plurality of patterns being determined according to information related to the original, and
wherein the controller is configured to obtain information related to an image of the first measurement pattern within the illuminated region, based on an output from the sensor obtained while illuminating the part of each of the plurality of patterns within the illuminated region and moving the substrate stage.

2. The apparatus according to claim 1, wherein the first measurement pattern is provided on the original stage.

3. The apparatus according to claim 1, wherein the measurement pattern is provided on the original.

4. The apparatus according to claim 1, wherein the information related to the original includes a line width and a line pitch of a device pattern of the original.

5. An exposure apparatus which protects an image of a pattern of an original onto a substrate by a projection optical system to expose the substrate to light, the apparatus comprising:

an original positioning mechanism configured to position an original stage which holds the original;
a substrate positioning mechanism configured to position a substrate stage which holds the substrate;
a measurement device mounted on the substrate stage; and
a controller,
wherein one of the original and the original stage is provided with a first measurement pattern including a plurality of patterns, at least one of pitches and widths thereof being different from each other, and the measurement device including a second measurement pattern, and a sensor configured to detect light passed through the first measurement pattern, the projection optical system, and the second measurement pattern,
wherein the controller is configured to determine an illuminated region, within which the first measurement pattern is to be illuminated, using information related to the original, and to obtain information related to an image of the first measurement pattern within the illuminated region, based on an output from the sensor obtained while illuminating the first measurement pattern within the determined illuminated region and moving the substrate stage, and
wherein the information related to the original includes a table obtained by associating a feature of a device pattern of the original and the illuminated region within which the first measurement pattern is to be illuminated with each other.

6. An exposure apparatus which projects an image of a pattern of an original onto a substrate by a projection optical system to expose the substrate to light, the apparatus comprising:

an original positioning mechanism configured to position an original stage which holds the original;
a substrate positioning mechanism configured to position a substrate stage which holds the substrate;
a measurement device mounted on the substrate stage; and
a controller,
wherein one of the original and the original stage is provided with a first measurement pattern including a plurality of patterns, at least one of pitches and widths thereof being different from each other, and the measurement device including a second measurement pattern, and a sensor configured to detect light passed through the first measurement pattern, the projection optical system, and the second measurement pattern,
wherein the controller is configured to determine an illuminated region, within which the first measurement pattern is to be illuminated, using information related to the original, and to obtain information related to an image of the first measurement pattern within the illuminated region, based on an output from the sensor obtained while illuminating the first measurement pattern within the determined illuminated region and moving the substrate stage, and
wherein the information related to the original includes a table obtained by associating the original and the illuminated region within which the first measurement pattern is to be illuminated with each other.

7. A method of manufacturing a device, the method comprising the steps of:

exposing a substrate to light using an exposure apparatus; and
developing the exposed substrate,
wherein the exposure apparatus is configured to project an image of a pattern of an original onto the substrate by a projection optical system to expose the substrate to light, and the apparatus comprises:
an original positioning mechanism configured to position an original stage which holds the original;
a substrate positioning mechanism configured to position a substrate stage which holds the substrate;
a measurement device mounted on the substrate stage; and
a controller,
wherein one of the original and the original stage is provided with a first measurement pattern including a plurality of patterns, at least one of pitches and widths thereof being different from each other, and the measurement device including a second measurement pattern, and a sensor configured to detect light passed through the first measurement pattern, the projection optical system, and the second measurement pattern,
wherein an illuminated region, within which the first measurement pattern is to be illuminated, is set so that a part of each of the plurality of patterns, which corresponds to area ratios of the patterns within the illuminated region, is illuminated, the area ratios of the plurality of patterns being determined according to information related to the original, and wherein the controller is configured to obtain information related to an image of the first measurement pattern within the illuminated region, based on an output from the sensor obtained while illuminating the part of each of the plurality of patterns within the illuminated region and moving the substrate stage.

8. The apparatus according to claim 1, wherein the second measurement pattern is obtained by reducing the first measurement pattern in accordance with a projection magnification of the projection optical system.

9. The apparatus according to claim 5, wherein the second measurement pattern is obtained by reducing the first measurement pattern in accordance with a projection magnification of the projection optical system.

10. The apparatus according to claim 6, wherein the second measurement pattern is obtained by reducing the first measurement pattern in accordance with a projection magnification of the projection optical system.

11. The method according to claim 7, wherein the second measurement pattern is obtained by reducing the first measurement pattern in accordance with a projection magnification of the projection optical system.

* * * * *